United States Patent [19]

Hider et al.

[11] 4,153,475

[45] May 8, 1979

[54] THREE DIMENSIONAL SOLAR PANEL ASSEMBLY

[76] Inventors: Ross B. Hider, 2752 29th St.; Ross J. Hider, 4062 Cherokee St., both of San Diego, Calif. 92104

[21] Appl. No.: 907,114

[22] Filed: May 18, 1978

[51] Int. Cl.² ............................................. H01L 31/04
[52] U.S. Cl. ................................................ 136/89 PC
[58] Field of Search .............. 136/89 P, 89 PC, 89 H

[56] References Cited

U.S. PATENT DOCUMENTS

| | | | |
|---|---|---|---|
| 3,419,434 | 12/1968 | Colehower | 136/89 |
| 3,490,950 | 1/1970 | Myer | 136/89 |
| 4,025,786 | 5/1977 | Hamilton | 250/211 R |
| 4,026,267 | 5/1977 | Coleman | 126/270 |
| 4,063,963 | 12/1977 | Bond, Jr. | 136/89 P |

Primary Examiner—Aaron Weisstuch
Attorney, Agent, or Firm—Brown & Martin

[57] ABSTRACT

A plurality of solar cell panel units arranged in side by side, parallel, spaced relation with light directing devices positioned between each of the solar panels and on each of the outer side surfaces of the solar panels, so that light received from the side edges of the solar panels is redirected to the facing surfaces of each of the solar cell panels, thus allowing solar panel units to be packaged in stacked arrangement for compact presentation to the sun to maximize power output.

5 Claims, 4 Drawing Figures 4,153,475

THREE DIMENSIONAL SOLAR PANEL ASSEMBLY

BACKGROUND OF THE INVENTION

The conversion of sunlight into power presents many practical problems. While sunlight may be converted on a large scale into a form which is in turn converted into electricity, such as through steam generating plants, there has not been a practical utilization of solar energy on a relatively small scale to drive relatively small electrical units such as radios, televisions, and the like.

Known solar cells convert sunlight directly into electric current. However, such solar cells are expensive and their efficiency is low. Further, such solar cells are limited by surface area presentation to sunlight. More importantly, such solar cells are limited in practical use because they are fragile, are easily damaged, and are not packaged in units that allow their practical use for on-the-spot power generation. Present systems do not achieve a reasonable degree of utilization of the sunlight in practical stacked arrangements.

It is therefore advantageous to provide a strong, three dimensional assembly of spaced solar cell panels that facilitates their adequate access to light, and yet provide a practical utilization of such solar cell panels in a packaged power generating unit.

SUMMARY OF THE INVENTION

In an exemplary embodiment of the three dimensional solar cell panel assembly, a plurality of solar cell panel units having substantially flat side surfaces and outer rectangular edges are aligned in spaced side by side, parallel arrangements. Light directing means are positioned between each of the solar cell panels so that light directed substantially toward the side edges of the solar cell panels will, in addition to obliquely contacting the side surfaces of the solar panels, also direct light into the light redirecting means that redirects the light to contact the side surfaces of the panels. This allows the solar panels to be packaged in stacked arrangements, and yet be presented to the light in the stacked arrangement in a manner that the light passes between the solar cell panels and contacts the side surfaces of the solar cell panels so that the entire packaged solar cell panel assembly generates usable power.

The solar cell panels are joined at their end edges to end plates that fix the correct alignment between the solar panels and the panel shaped light directing means, and are held rigidly in these positions. With top and bottom covers, a box enclosure is formed. The box may be enclosed as necessary to protect the solar panels from the elements, and yet provide a rigid structure that may be subjected to normal use and wear and tear, and still not allow injurious contact with the fragile side surfaces of the individual solar cells. This provides a practical package for providing power output for immediate, on-the-spot use through multiple solar cell panels, that is, packaged for practical use.

The light directing or redirecting panels in the exemplary embodiment comprise vertically and horizontally arranged transparent balls that may be optical glass or may be made of plastic. The balls are held in the panel by horizontal transparent rods that are held in position by vertical section members. The balls receive and transmit the light both outwardly to the panels, and vertically, thus spreading the light received from the side edges to a distribution across the side surfaces of the solar panels.

It is therefore an object of this invention to provide a new and improved solar cell panel construction and arrangement that provides a three dimensional solar cell panel assembly that is capable of generating power from side edge light, and that allows solar cell panels to be stacked in a composite solar cell panel unit that may be packaged into a relatively rigid and strong structure.

Other objects and many advantages of this invention will be more apparent upon a reading of the following detailed description and an examination of the drawing, wherein like reference numerals designate like parts throughout and in which.

Figure 1:
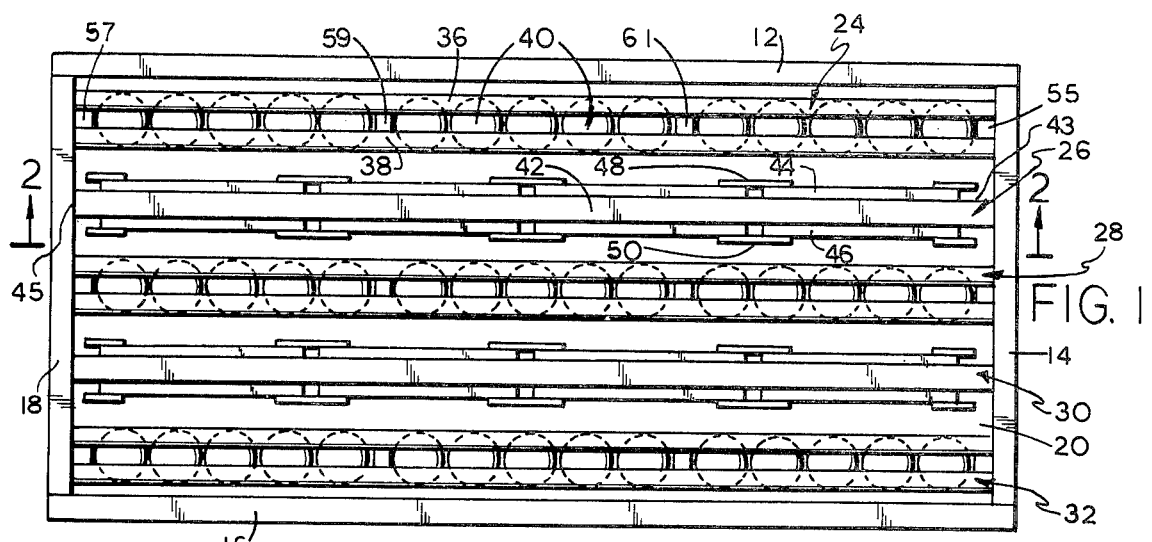
FIG. 1 is a top plan view of an embodiment of the invention, with the top cover removed.

Referring now to the drawing, a rectangular box-shaped structure encloses the three dimensional solar panel assembly 10. The walls of the enclosure, which may be made of plastic and are transparent, comprise sides 12, 14, 16 and 18; with a bottom member 20 and an upper cover 22. The respective solar cell panels 26 and 30 are positioned in the enclosure. Each of these solar cell panels comprises a panel member, as for example panel 42, on which are mounted a plurality of solar cells, as for example, solar cells 44 and 46. The solar cells are electrically connected by electrical connectors 48, 50, 75, 77 and 79 (See FIG. 4). The transparent structural panel 42 may comprise any suitable material, such as plastic or the like, and is secured at its ends 43 and 45 to the end wall members 14 and 18.

Figure 3:
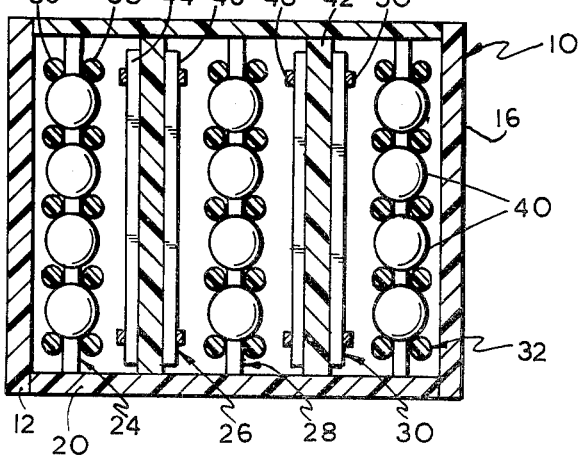
FIG. 3 is a crosswise section of the embodiment of FIGS. 1 and 2, taken along lines 3—3 of FIG. 2.

Each of the light directing means comprises light receiving and directing panels 24, 28 and 32. Each of these panels, as for example panel 24, see FIGS. 1 and 3, comprises rows of transparent light directing balls 40 that are arranged longitudinally and vertically and are held in position by pairs of longitudinal rods 36, 38. The ends of the respective rods 36, 38 are connected to vertical end members 55 and 57 that are in turn secured to end plates 14 and 18. Also positioned midway the length of the light redirecting panels are vertical members 59 and 61 that maintain rigidity and integrity of the panels 24 along the length thereof.

While each of the respective panels may be connected to the bottom member 20, normally the securing of the panels at each of their ends provides sufficient strength and connection to maintain the structural integrity of the unit.

Figure 2:
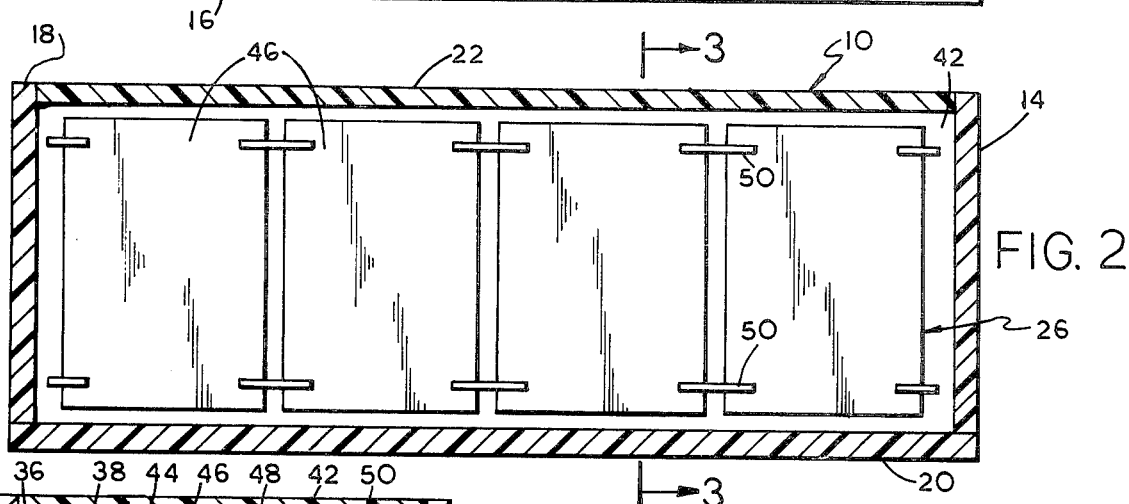
FIG. 2 is a lengthwise section of the embodiment of FIG. 1, taken along lines 2—2.
Figure 4:
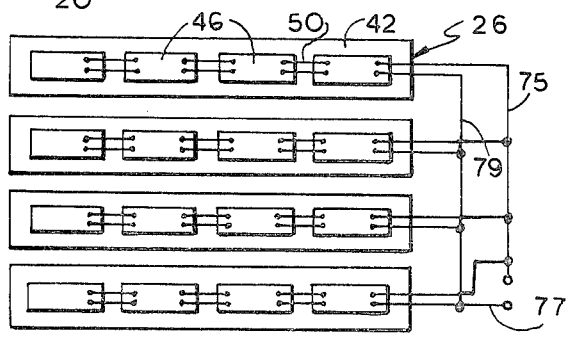
FIG. 4 is the diagram of the electrical wiring interconnecting the solar cells.

The cover 22 as well as the side members 12, 14, 16 and 18 are all transparent, so that light may be received therethrough and directed to the solar cells. Referring to FIG. 2, it may be understood that each of the solar cell panels, as for example solar cell panel 26, has a plurality of solar cells 46 positioned thereon that are electrically connected to provide the desired voltage and amperage output commensurate with the particular solar cells used, through the electrical connections as illustrated in FIG. 4.

In operation, the solar cell panel assembly is generally oriented so that the light source is normal to the upper cover 22. The light then passes through the transparent cover 22 and contacts the surfaces of the solar cells and the respective transparent members of the light receiving and redirecting panels. Each of the spherical balls 40 may be made of optical glass, or can be made of plastic. Each of the rods 36 and 38 are transparent and also may be made of plastic. As the light contacts these members, the light passes through to the next succeeding balls, and the next succeeding rods, and on through the panel. Additionally, the light is redirected by the respective members and is refracted outwardly, where it contacts the adjacent side surfaces of the solar cells 46. Also since the light is a movable source, and the panel is also movable, the cover 22 will often be at an angle to normal relative to the light. Thus, the light will directly contact the side surfaces of the respective solar cell panels that are on the side to which the light is received.

The composite package provides a strong structural panel that may be used in normal applications that may involve some physical abuse. The structure also provides protection of the panels against the elements, and makes it possible to utilize more solar cells with a greater solar cell surface area in a limited physical area.

Having described our invention, we now claim:

1. A three dimensional solar panel assembly, comprising:
   an enclosure which is at least partially transparent to light, said enclosure containing at least a pair of elongated solar cell panels in closely spaced, side-by-side parallel relation;
   each of said solar cell panels having side edges and substantially flat side surfaces between the side edges;
   and light directing means positioned on each side of each of the solar cell panels for receiving light directed primarily at said side edges and redirecting the received light to the side surfaces of the solar cell panels;
   said light directing means comprising a plurality of light transparent balls held together in a light transparent panel structure.

2. An assembly as claimed in claim 1, wherein:
   one side edge of each of said solar cell panels forms an upper side edge and the opposite side edge forms a lower side edge,
   said solar cell panels having a substantial depth between said upper and lower side edges;
   and said light directing means comprises a plurality of light directing panels having means for absorbing and redirecting light to substantially all of the side surfaces of each solar panel, which light directing panels extend substantially the length of said solar cell panels, whereby each of said solar cell panels in a stacked, closely spaced arrangement receives light.

3. An assembly as claimed in claim 2, wherein:
   said light directing panels each have a plurality of light transparent rods connected to spaced posts, with rows of said transparent balls positioned between and held by said transparent rods;
   said rows of balls being arranged in multi-layers, extending the depth of the solar cell panels between said upper and lower side edges.

4. An assembly as claimed in claim 4, wherein:
   said enclosure has vertically arranged end walls;
   the opposite ends of each of said light directing panels being fixed to said end walls;
   and opposite ends of each of said solar cell panels being connected to said end walls in spaced relation to maintain a rigid, box-like structure which holds said solar cell panels and said light directing panels in fixed aligned positions in the side-by-side, parallel relation.

5. An assembly as claimed in claim 4, wherein:
   said enclosure further includes a pair of side walls, a bottom member and a transparent top cover, for enclosing said solar cell panels and said light directing panels into an enclosed three dimensional solar panel assembly.

* * * * *

UNITED STATES PATENT AND TRADEMARK OFFICE
CERTIFICATE OF CORRECTION

PATENT NO. : 4,153,475
DATED : May 8, 1979
INVENTOR(S) : Ross Brian Hider (and) Ross John Hider It is certified that error appears in the above-identified patent and that said Letters Patent are hereby corrected as shown below:

Column 4, Line 23, in Claim 4, "An assembly as claimed in claim 4," should read --An assembly as claimed in claim 3,--.

*Signed and Sealed this*

*Twenty-eighth* Day of *August 1979*

[SEAL]

Attest:

Attesting Officer

LUTRELLE F. PARKER
*Acting Commissioner of Patents and Trademarks*